(12) United States Patent
Salter et al.

(10) Patent No.: US 8,575,949 B2
(45) Date of Patent: Nov. 5, 2013

(54) PROXIMITY SENSOR WITH ENHANCED ACTIVATION

(75) Inventors: Stuart C. Salter, White Lake, MI (US); Cornel Lewis Gardner, Romulus, MI (US); Scott Simon, Shelby Township, MI (US); Raymond Anthony Oldani, Canton, MI (US); Jeffrey Singer, Canton, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 409 days.

(21) Appl. No.: 12/868,281

(22) Filed: Aug. 25, 2010

(65) Prior Publication Data

US 2012/0049870 A1    Mar. 1, 2012

(51) Int. Cl.
*G01R 27/08* (2006.01)

(52) U.S. Cl.
USPC .......................................................... 324/686

(58) Field of Classification Search
USPC .......................................................... 324/686
See application file for complete search history.

(56) References Cited

U.S. PATENT DOCUMENTS

| | | |
|---|---|---|
| 3,382,588 A | 5/1968 | Serrell et al. |
| 3,826,979 A | 7/1974 | Steinmann |
| 4,257,117 A | 3/1981 | Besson |
| 4,290,052 A | 9/1981 | Eichelberger et al. |
| 4,413,252 A | 11/1983 | Tyler et al. |
| 4,613,802 A | 9/1986 | Kraus et al. |
| 4,743,895 A | 5/1988 | Alexander |
| 4,748,390 A | 5/1988 | Okushima et al. |
| 4,758,735 A | 7/1988 | Ingraham |
| 4,821,029 A | 4/1989 | Logan et al. |
| 4,872,485 A | 10/1989 | Laverty, Jr. |
| 4,899,138 A | 2/1990 | Araki et al. |
| 4,924,222 A | 5/1990 | Antikidis et al. |
| 4,972,070 A | 11/1990 | Laverty, Jr. |
| 5,025,516 A | 6/1991 | Wilson |
| 5,033,508 A | 7/1991 | Laverty, Jr. |
| 5,159,159 A | 10/1992 | Asher |
| 5,239,152 A | 8/1993 | Caldwell et al. |
| 5,270,710 A | 12/1993 | Gaultier et al. |
| 5,451,724 A | 9/1995 | Nakazawa et al. |
| 5,467,080 A | 11/1995 | Stoll et al. |
| 5,566,702 A | 10/1996 | Philipp |

(Continued)

FOREIGN PATENT DOCUMENTS

| | | |
|---|---|---|
| EP | 1562293 | 8/2005 |
| GB | 2409578 | 6/2005 |

(Continued)

OTHER PUBLICATIONS

ATMEL™ Touch Sensor Design Guide, 10620D-AT42-04/09.

*Primary Examiner* — Jermele M Hollington
*Assistant Examiner* — Demetrius Pretlow
(74) *Attorney, Agent, or Firm* — Vichit Chea; Price Heneveld LLP

(57) ABSTRACT

A vehicle component is provided that includes a console surface, at least one circuit board proximate the console surface, and an array of proximity sensors electrically connected to the at least one circuit board. Each of the proximity sensors emit a field that combine to form an activation field, wherein a lateral direction of the activation field extending approximately parallel to the console surface is greater than a longitudinal direction of the activation field extending approximately perpendicular to the console surface.

22 Claims, 4 Drawing Sheets

(56) References Cited

U.S. PATENT DOCUMENTS

| | | |
|---|---|---|
| 5,572,205 A | 11/1996 | Caldwell et al. |
| 5,598,527 A | 1/1997 | Debrus et al. |
| 5,670,886 A | 9/1997 | Wolff et al. |
| 5,730,165 A | 3/1998 | Philipp |
| 5,747,756 A | 5/1998 | Boedecker |
| 5,760,554 A | 6/1998 | Bustamante |
| 5,790,107 A | 8/1998 | Kasser et al. |
| 5,796,183 A | 8/1998 | Hourmand |
| 5,917,165 A | 6/1999 | Platt et al. |
| 5,920,309 A | 7/1999 | Bisset et al. |
| 5,942,733 A | 8/1999 | Allen et al. |
| 5,973,417 A | 10/1999 | Goetz et al. |
| 5,973,623 A | 10/1999 | Gupta et al. |
| 6,010,742 A | 1/2000 | Tanabe et al. |
| 6,011,602 A | 1/2000 | Miyashita et al. |
| 6,014,602 A * | 1/2000 | Kithil et al. ............... 701/45 |
| 6,040,534 A | 3/2000 | Beukema |
| 6,157,372 A | 12/2000 | Blackburn et al. |
| 6,288,707 B1 | 9/2001 | Philipp |
| 6,320,282 B1 | 11/2001 | Caldwell |
| 6,323,919 B1 | 11/2001 | Yang et al. |
| 6,377,009 B1 | 4/2002 | Philipp |
| 6,379,017 B2 | 4/2002 | Nakabayashi et al. |
| 6,452,514 B1 | 9/2002 | Philipp |
| 6,466,036 B1 | 10/2002 | Philipp |
| 6,529,125 B1 | 3/2003 | Butler et al. |
| 6,535,200 B2 | 3/2003 | Philipp |
| 6,559,902 B1 | 5/2003 | Kusuda et al. |
| 6,614,579 B2 * | 9/2003 | Roberts et al. ............... 359/267 |
| 6,654,006 B2 | 11/2003 | Kawashima et al. |
| 6,661,410 B2 | 12/2003 | Casebolt et al. |
| 6,664,489 B2 | 12/2003 | Kleinhans et al. |
| 6,713,897 B2 | 3/2004 | Caldwell |
| 6,734,377 B2 | 5/2004 | Gremm et al. |
| 6,738,051 B2 | 5/2004 | Boyd et al. |
| 6,773,129 B2 | 8/2004 | Anderson, Jr. et al. |
| 6,794,728 B1 * | 9/2004 | Kithil ............... 257/532 |
| 6,819,316 B2 | 11/2004 | Schulz et al. |
| 6,825,752 B2 * | 11/2004 | Nahata et al. ............... 340/5.64 |
| 6,891,530 B2 | 5/2005 | Umemoto et al. |
| 6,897,390 B2 | 5/2005 | Caldwell et al. |
| 6,940,291 B1 | 9/2005 | Ozick |
| 6,960,735 B2 * | 11/2005 | Hein et al. ............... 200/600 |
| 7,030,513 B2 | 4/2006 | Caldwell |
| 7,053,360 B2 | 5/2006 | Balp et al. |
| 7,091,886 B2 | 8/2006 | DePue et al. |
| 7,151,532 B2 | 12/2006 | Schulz |
| 7,154,481 B2 | 12/2006 | Cross et al. |
| 7,180,017 B2 | 2/2007 | Hein |
| 7,186,936 B2 | 3/2007 | Marcus et al. |
| 7,215,529 B2 | 5/2007 | Rosenau |
| 7,218,498 B2 | 5/2007 | Caldwell |
| 7,232,973 B2 | 6/2007 | Kaps et al. |
| 7,242,393 B2 | 7/2007 | Caldwell |
| 7,248,151 B2 | 7/2007 | McCall |
| 7,248,955 B2 | 7/2007 | Hein et al. |
| 7,254,775 B2 | 8/2007 | Geaghan et al. |
| 7,255,622 B2 | 8/2007 | Stevenson et al. |
| 7,339,579 B2 | 3/2008 | Richter et al. |
| 7,342,485 B2 | 3/2008 | Joehl et al. |
| 7,361,860 B2 | 4/2008 | Caldwell |
| 7,445,350 B2 * | 11/2008 | Konet et al. ............... 362/84 |
| 7,531,921 B2 * | 5/2009 | Cencur ............... 307/126 |
| 7,898,531 B2 * | 3/2011 | Bowden et al. ............... 345/173 |
| 7,957,864 B2 * | 6/2011 | Lenneman et al. ............... 701/36 |
| 7,989,752 B2 * | 8/2011 | Yokozawa ............... 250/208.1 |
| 8,090,497 B2 * | 1/2012 | Ando ............... 701/36 |
| 2002/0040266 A1 * | 4/2002 | Edgar et al. ............... 701/49 |
| 2002/0167439 A1 | 11/2002 | Bloch et al. |
| 2002/0167704 A1 | 11/2002 | Kleinhans et al. |
| 2003/0002273 A1 * | 1/2003 | Anderson et al. ............... 362/84 |
| 2003/0122554 A1 * | 7/2003 | Karray et al. ............... 324/662 |
| 2004/0056753 A1 | 3/2004 | Chiang et al. |
| 2005/0137765 A1 * | 6/2005 | Hein et al. ............... 701/36 |
| 2006/0038793 A1 * | 2/2006 | Philipp ............... 345/173 |
| 2006/0044800 A1 * | 3/2006 | Reime ............... 362/276 |
| 2006/0082545 A1 | 4/2006 | Choquet et al. |
| 2006/0262549 A1 * | 11/2006 | Schmidt et al. ............... 362/459 |
| 2007/0008726 A1 * | 1/2007 | Brown ............... 362/276 |
| 2007/0051609 A1 | 3/2007 | Parkinson |
| 2008/0202912 A1 | 8/2008 | Boddie et al. |
| 2008/0238650 A1 * | 10/2008 | Riihimaki et al. ............... 340/501 |
| 2008/0257706 A1 | 10/2008 | Haag |
| 2008/0272623 A1 | 11/2008 | Kadzban et al. |
| 2009/0108985 A1 | 4/2009 | Haag et al. |
| 2010/0001974 A1 * | 1/2010 | Su et al. ............... 345/174 |
| 2010/0296303 A1 * | 11/2010 | Sarioglu et al. ............... 362/487 |
| 2011/0012623 A1 * | 1/2011 | Gastel et al. ............... 324/686 |
| 2011/0082616 A1 * | 4/2011 | Small et al. ............... 701/29 |
| 2011/0134054 A1 * | 6/2011 | Woo et al. ............... 345/173 |
| 2011/0279276 A1 * | 11/2011 | Newham ............... 340/573.4 |

FOREIGN PATENT DOCUMENTS

| | | |
|---|---|---|
| GB | 2418741 | 4/2006 |
| JP | 07315880 | 12/1995 |
| JP | 08138445 | 5/1996 |
| JP | 11065764 | 3/1999 |
| JP | 11316553 | 11/1999 |
| JP | 2000047178 | 2/2000 |
| JP | 2000075293 | 3/2000 |
| WO | 9963394 | 12/1999 |
| WO | 2007022027 | 2/2007 |
| WO | 2008121760 | 10/2008 |

* cited by examiner

PROXIMITY SENSOR WITH ENHANCED ACTIVATION

FIELD OF THE INVENTION

The present invention generally relates to a vehicle component, and more particularly, a vehicle component having one or more proximity sensors with an enhanced activation field.

BACKGROUND OF THE INVENTION

Typically, various vehicle components require switches, such as, switches for operating windows, headlights, windshield wipers, moon roofs, and radios. Generally, these types of switches need to be actuated in order to activate or deactivate the device or perform another type of control function. Thus, the switches themselves clearly indicate the type of actuation that is needed to create such a control signal.

SUMMARY OF THE INVENTION

Accordingly, in a first disclosed embodiment, a vehicle component is provided that includes a console surface, at least one circuit board proximate the console surface, and an array of proximity sensors electrically connected to the at least one circuit board. Each of the proximity sensors emit a field that combine to form an activation field, wherein a lateral direction of the activation field extending approximately parallel to the console surface is greater than a longitudinal direction of the activation field extending approximately perpendicular to the console surface.

In another disclosed embodiment, a vehicle component is provided that includes a console surface, at least one circuit board proximate the console surface, and at least one light source intermediate to the at least one circuit board and the at least one console surface, wherein the at least one light source emits light into an area between the at least one circuit board and the at least one console surface and the emitted light is viewed through the at least one console surface. The vehicle component further includes an array of capacitive proximity sensors electrically connected to the at least one circuit board, each of the capacitive proximity sensors emit a capacitive field that combine to form an activation field, wherein a lateral direction of the activation field extending approximately parallel to the console surface is greater than a longitudinal direction of the activation field extending approximately perpendicular to the console surface.

In another disclosed embodiment, a vehicle component is provided that includes a console surface that defines an activation surface, a circuit board proximate the activation surface, and an array of capacitive sensors, each of which emit a field that combine to form an activation field, wherein a lateral direction of the activation field is approximately equal to the activation surface and greater than a longitudinal direction of the activation field.

These and other aspects, objects, and features of the present invention will be understood and appreciated by those skilled in the art upon studying the following specification, claims, and appended drawings.

DETAILED DESCRIPTION OF PREFERRED EMBODIMENTS

Figure 1:
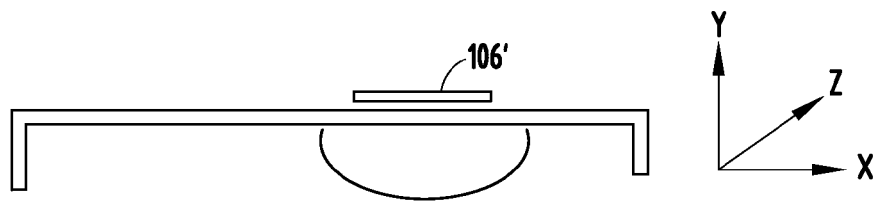
FIG. 1 is a schematic diagram of a prior art proximity switch.

As required, detailed embodiments of the present invention are disclosed herein; however, it is to be understood that the disclosed embodiments are merely exemplary of the invention that may be embodied in various and alternative forms. The figures are not necessarily to a detailed design; some schematics may be exaggerated or minimized to show function overview. Therefore, specific structural and functional details disclosed herein are not to be interpreted as limiting, but merely as a representative basis for teaching one skilled in the art to variously employ the present invention.

With respect to FIGS. 3-9, a vehicle component is generally shown at reference identifier 100. The vehicle component can include a console surface generally indicated at reference identifier 102, and at least one circuit board 104 proximate the console surface 102. The vehicle component can also include an array of proximity sensors 106 that are electrically connected to the circuit board 104. Typically, each of the proximity sensors 106 can emit a field 108 that combine to form an activation field, generally indicated at reference identifier 110. A lateral direction of the activation field 110 extending approximately parallel to the console surface 102 (e.g., x-axis) can be greater than the longitudinal direction of the activation field 110 extending approximately perpendicular to the console surface 102 (e.g., y-axis), as described in greater detail herein.

Figure 2:
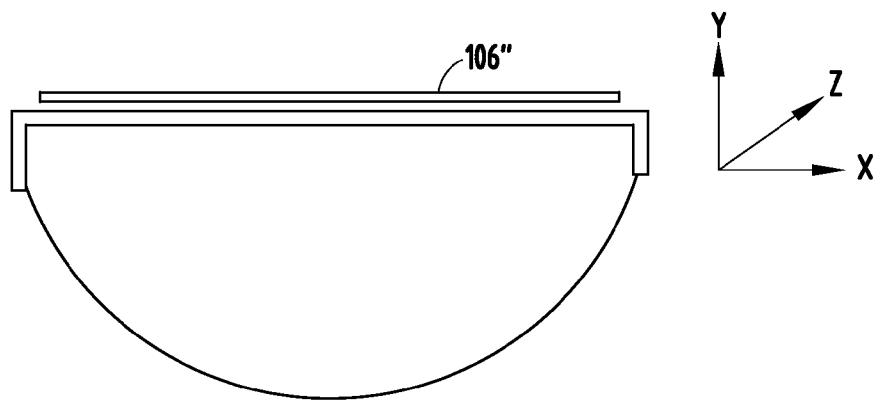
FIG. 2 is a schematic diagram of a prior art proximity switch.

As illustrated in FIG. 1, a prior art proximity switch that includes a single proximity sensor 106' emits a field that extends outwardly an adequate longitudinal distance, but does not extend laterally an adequate distance. In such a device, it can be difficult for a user to find and interfere with the field to actuate the switch, since the field does not adequately extend along the lateral distance. Alternatively, the prior art device illustrated in FIG. 2 includes a larger proximity sensor 106", which emits a field that extends laterally an adequate distance, but extends a distance in the longitudinal direction that is greater than desired. By having the field extend longitudinally at an undesirably great distance, the sensor 106" is more likely to be inadvertently actuated. For example if the proximity sensor 106" is on a roof of a vehicle, the field extends downward longitudinally an undesirable distance into the vehicle cabin, which enhances the probability of an accidental activation as a passenger moves about the vehicle cabin. Additionally, it typically takes a much larger object to significantly interrupt the field in order to actuate the switch of FIG. 2, when compared to the switch of FIG. 1 (e.g., a whole hand may be required to activate the proximity switch rather than a fingertip).

Therefore, it can be desirable to have the activation field 110 that extends across an activation surface 112 laterally, but does not extend outwards longitudinally from the console surface 102 to an undesirably great distance. If the activation field extends from the console surface in the longitudinal direction, an undesirable distance, there can be an increased likelihood of inadvertent actuations. Further, such an undesirable longitudinal direction distance typically results in a field that requires larger objects to significantly interrupt, as compared to an activation field that does not extend to such a distance in the longitudinal direction.

Figure 3:
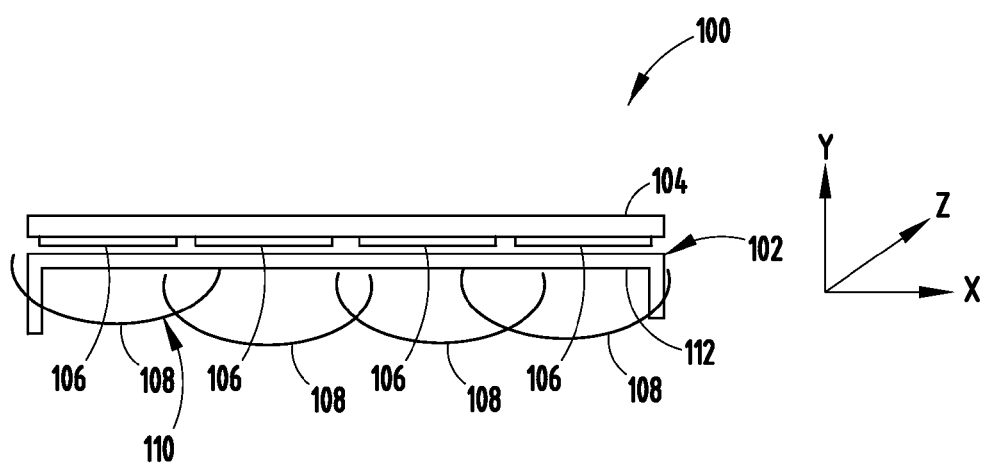
FIG. 3 is a schematic diagram of a vehicle component having an array of proximity sensors, in accordance with one embodiment of the present invention.

As illustrated in FIG. 3, the activation field 110 can have approximately a rectangular shape as a result of each individual proximity sensor 106 having an arched shaped field 108. However, it should be appreciated by those skilled in the art that the array of proximity sensors 106 can be a one- or two-dimensional array, and the activation field 110 can have a three dimensional shape. Any planar shape and distance along any dimension (e.g., the x-, y-, and/or z-axis) of the activation field 110 can be at least partially based upon and controlled by the spacing of the proximity sensors 106 within the array.

According to one embodiment, the proximity sensors 106 can be capacitive sensors. Thus, the fields 108 of each proximity sensor 106 and the activation field 110 is a capacitive field. However, it should be appreciated by those skilled in the art that additional or alternative types of proximity sensors can be used, such as, but not limited to, inductive sensors, optical sensors, temperature sensors, resistive sensors, the like, or a combination thereof. Exemplary proximity sensors are described in the April, 2009 ATMEL® Touch Sensors Design Guide, 10620D-AT42-04/09, the entire reference hereby being incorporated herein by reference.

Typically, the console surface 102 defines the activation surface 112, wherein the lateral direction of the activation field 110 is approximately equal to the activation surface 112. As illustrated in FIG. 3, the array of proximity sensors 106 each create separate fields 108, but when combined form the activation field 110 that adequately extends along the lateral distance of the activation surface 112, while extending at an adequate distance longitudinally outwards from the console surface 102. It should be appreciated by those skilled in the art that other elements of the vehicle component 100 or other vehicular elements proximate thereto can affect the shape of the fields 108 of the proximity sensors 106, and thus, the shape of the activation field 110.

Each of the proximity sensors 106 of the array are not typically independently controlled, such that any activation of any of the proximity sensors 106 of the array will activate the vehicle component 100, according to one embodiment. Thus, which proximity sensor 106 is activated first, the order of activation, or an amount of capacitive change of the individual fields 108 may not be considered, but only some capacitive change in one or more of the fields 108 may be determined. There can be a threshold value for a capacitive change in the fields 108 before the vehicle component 100 is activated, deactivated, and/or altered to reduce a likelihood of inadvertent actuation.

Figure 4:
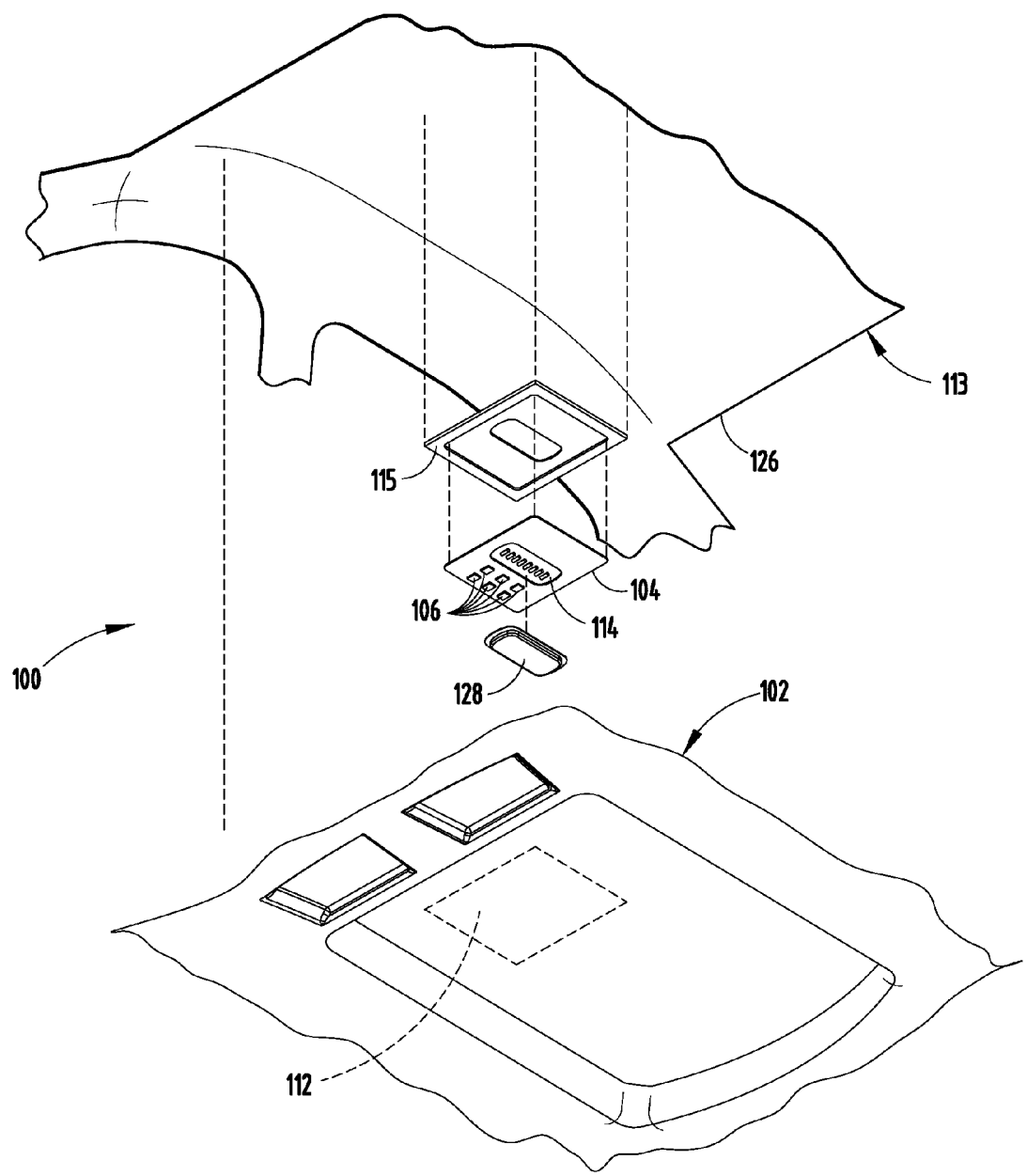
FIG. 4 is an exploded perspective view of a vehicle component having an array of proximity sensors, in accordance with one embodiment of the present invention.
Figure 5:
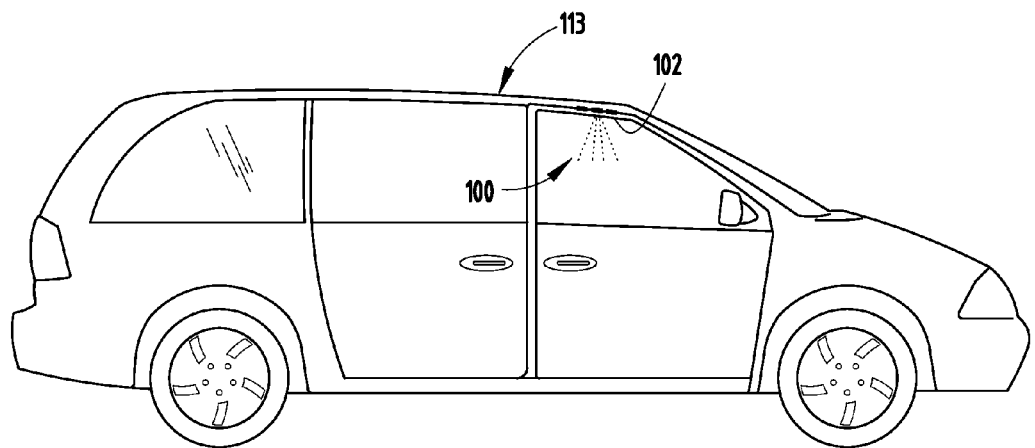
FIG. 5 is an environmental view of a vehicle component being a hidden dome lamp, in accordance with one embodiment of the present invention.
Figure 6:
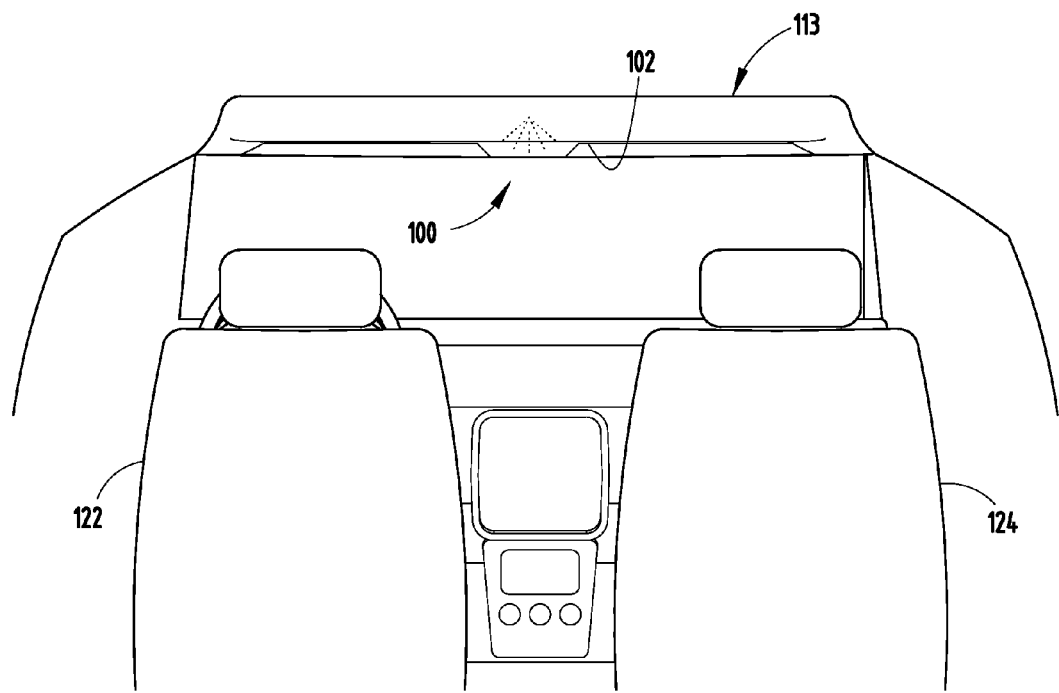
FIG. 6 is an environmental view of a vehicle component being a hidden dome lamp, in accordance with one embodiment of the present invention.

According to one embodiment, as illustrated in FIGS. 4-6, the vehicle component 100 can be a hidden dome lamp, wherein the console surface 102 is a headliner of a vehicle generally indicated at reference identifier 113. In such an embodiment, the vehicle component 100 can include at least one light source 114 that is proximate to the console surface 102 and configured to emit light through the console surface 102. The light source 114 can be one or more light emitting diodes (LEDs). Exemplary hidden dome lamps are described in U.S. patent application Ser. No. 12/390,495, entitled "CONCEALED INTERIOR LIGHTING FOR AUTOMOBILES," now U.S. Pat. No. 8,162,519, U.S. patent application Ser. No. 12/577,294, entitled "HIDDEN LAMP MANUFACTURING PROCESS," and U.S. patent application Ser. No. 12/858,486, entitled "VEHICLE INTERIOR LIGHT CONFIGURED TO COLOR CORRECT AND METHOD THEREOF," now abandoned, the entire references hereby being incorporated herein by reference.

In an embodiment where the vehicle component 100 is a hidden dome lamp, the circuit board 104 can be attached to a frame 115. Typically, such an attachment is a mechanical attachment; however, it should be appreciated by those skilled in the art that other suitable attachments can be utilized. The frame 115 can be attached to a roof support structure 126. Thus, the vehicle component 100 being a hidden dome lamp is integrated into a roof of the vehicle 113, and configured to emit light that is viewed through a lens 128 and the console surface 102.

Figure 7:
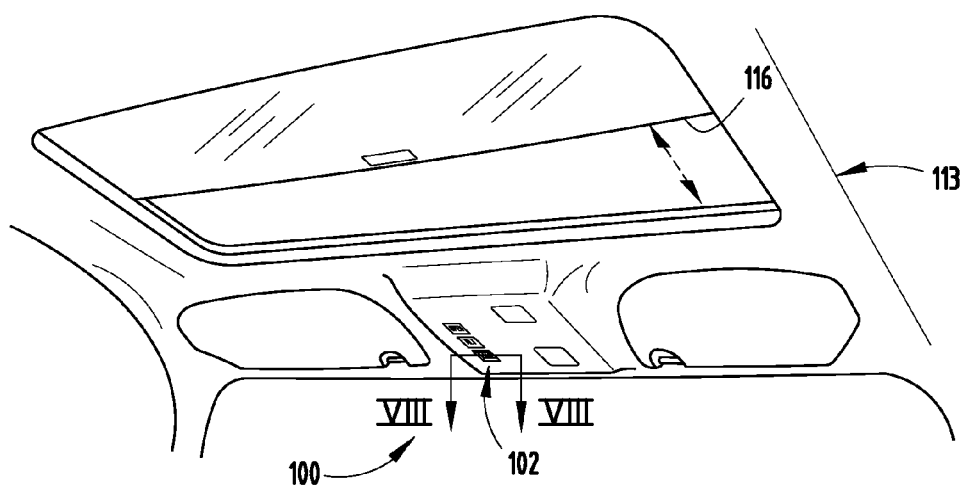
FIG. 7 is an environmental view of a vehicle component being a moon roof switch, in accordance with one embodiment of the present invention.
Figure 8:
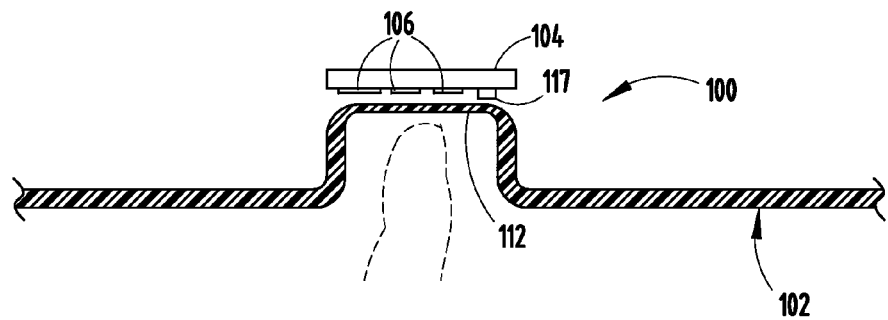
FIG. 8 is a cross-sectional view of the vehicle component illustrated in FIG. 7 across the lines VIII-VIII, in accordance with one embodiment of the present invention.

Alternatively, as exemplary illustrated in FIGS. 7 and 8, the vehicle component 100 can be a capacitive moon roof switch. In such an embodiment, activation of the proximity sensor 106 can cause the moon roof 116 to move in an open or closed direction, or stop movement of the moon roof 116 based upon a control algorithm, wherein at least a portion of the proximity sensors 106 forming the array are not independently controlled. It should be appreciated by those skilled in the art that additional or alternative control algorithms can be implemented. The capacitive moon roof switch can also include one or more light sources 117 that backlights the circuit board 104 or emits light between the circuit board 104 and the console surface 102, such that the emitted light is viewed through the console surface 102. An exemplary capacitive moon roof switch is described in U.S. patent application Ser. No. 12/788,663, entitled "VEHICLE CONTROL SYSTEM WITH PROXIMITY SWITCH AND METHOD THEREOF," now U.S. Pat. No. 8,283,800, the entire reference hereby being incorporated herein by reference.

According to one embodiment, the vehicle component 100 can include a plurality of arrays of proximity sensors 106, wherein each of the plurality of arrays are independently controlled. By way of explanation and not limitation, the vehicle component 100 can be the capacitive moon roof switch, wherein the "open" switch includes a first array, the "tilt" switch includes a second array, and the "close" switch includes a third array. Thus, the first, second, and third arrays can be independently controlled, while the individual proximity sensors 106 of each of the first, second, and third arrays are not independently controlled.

Figure 9:
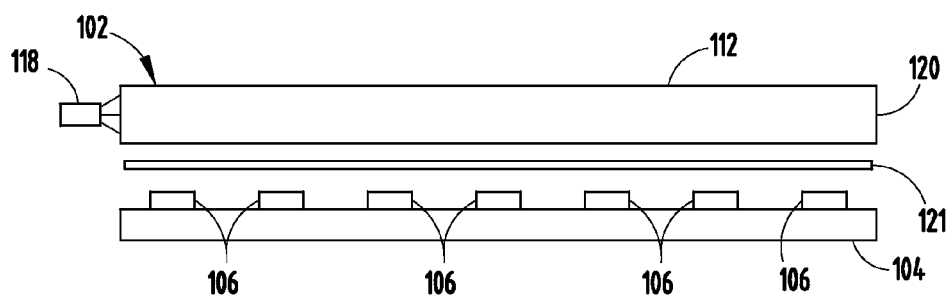
FIG. 9 is a schematic diagram of a vehicle component being a light bar switch, in accordance with one embodiment of the present invention.

With respect to FIG. 9, according to one embodiment, the vehicle component 100 can be a light bar switch. The light bar switch can be used to control at least one light source 118 contained therein, one or more other vehicle 113 component or device, the like, or a combination thereof. For purposes of explanation and not limitation, other vehicle 113 components can include, but are not limited to, climate control, a radio, other entertainment systems, the like, or a combination thereof.

In such an embodiment, the light source 118 can be intermediate to the circuit board 104 and the console surface 102.

The light source 118 can be one or more LEDs, configured to emit light having different hues (e.g., multi-color), the like, or a combination thereof. The light source 118 can emit light into an area 120 between the circuit board 104 and the console surface 102, wherein the emitted light is viewed through the console surface 102. The light bar switch can include an at least partially reflective surface 121 intermediate to the console surface 102 and the circuit board 104, such that the at least partially reflective surface 121 can be configured to reflect light to be viewed through the console surface 102 and be adequately opaque so the circuit board 114 is not viewed through the console surface 102.

It should be appreciated by those skilled in the art that the console surface 102 can be other surfaces within a vehicle 122. For purposes of explanation and not limitation, the console surface 102 can be a headliner, a dashboard, an interior panel, an exterior panel, a center console between a driver's seat 122 and a passenger's seat 124, a console extending along a pillar of the vehicle 113, the like, or a combination thereof.

According to one embodiment, the array of proximity sensors 106 can be an N×1 array. Thus, the "1" sensor can be in the x or y direction, and the "N" sensor can be any number of sensors, in the other of the x and y direction, such that the array can be a 1×1 array, 2×1 array, a 3×1 array, etc. Alternatively, the array of proximity sensors 106 can be at least a 2×2 array, such that the array has at least two sensors in both the x and y direction.

In any of the embodiments described herein, the vehicle component 100 can include and/or be in communication with one or more controllers, one or more memory devices that store one or more executable software routines, other suitable hardware circuitry, other suitable software, the like, or a combination thereof, such that activation of the array of proximity sensors 106 can be communicated to perform a function.

Advantageously, the vehicle component 100 includes the array of proximity sensors 106 so that the activation field 110 extends adequately in the lateral direction to correspond with the activation surface 112, while not extending in a longitudinally direction at an undesirably great distance, which can increase the likelihood of accidental activation and can result in decreased sensitivity. It should be appreciated by those skilled in the art that the vehicle component 100 can have additional or alternative advantages not explicitly described herein. Further, it should be appreciated by those skilled in the art that the above-described components can be combined in additional or alternative manners, not explicitly described herein.

It is to be understood that variations and modifications can be made on the aforementioned structure without departing from the concepts of the present invention, and further it is to be understood that such concepts are intended to be covered by the following claims unless these claims by their language expressly state otherwise.

We claim:

1. A vehicle component comprising:
   a console surface;
   at least one circuit board proximate said console surface; and
   an array of proximity sensors electrically connected to said at least one circuit board, each of said proximity sensors emit a field that combine to form an activation field to activate a single proximity switch responsive to a user finger, wherein a lateral direction of said activation field extending approximately parallel to said console surface is greater than a longitudinal direction of said activation field extending approximately perpendicular to said console surface.

2. The vehicle component of claim 1, wherein said proximity sensors are capacitive sensors.

3. The vehicle component of claim 1, wherein said console surface defines an activation surface, wherein said lateral direction of said activation field is approximately equal to said activation surface.

4. The vehicle component of claim 1 being a hidden dome lamp, wherein said console surface is a headliner.

5. The vehicle component of claim 4 further comprising at least one light source proximate said console surface configured to emit light through said console surface.

6. The vehicle component of claim 1 being a capacitive moon roof switch.

7. The vehicle component of claim 1 being a light bar switch.

8. The vehicle component of claim 7 further comprising at least one light source intermediate to said at least one circuit board and said console surface, wherein said light source emits light into an area between said at least one circuit board and said console surface and said emitted light is viewed through said console surface.

9. The vehicle component of claim 1, wherein said array of proximity sensors is a N×1 array.

10. The vehicle component of claim 1, wherein said array of proximity sensors is at least a 2×2 array.

11. The vehicle component of claim 1, wherein said console surface comprises at least one of the following:
   a headliner;
   a dashboard;
   an interior panel;
   and exterior panel;
   a center console between a driver's seat and a passenger's seat; and
   a console extending along a pillar of the vehicle.

12. A vehicle component comprising:
   a console surface;
   at least one circuit board proximate said console surface;
   at least one light source intermediate to said at least one circuit board and said at least one console surface, wherein said at least one light source emits light into an area between said at least one circuit board and said at least one console surface and said emitted light is viewed through said at least one console surface; and
   an array of capacitive proximity sensors electrically connected to said at least one circuit board, each of said capacitive proximity sensors emit a capacitive field that combine to form an activation field to activate a single proximity switch responsive to a user finger, wherein a lateral direction of said activation field extending approximately parallel to said console surface is greater than a longitudinal direction of said activation field extending approximately perpendicular to said console surface.

13. The vehicle component of claim 12, wherein said console surface defines an activation surface, wherein said longitudinal direction of said activation field is approximately equal to said activation surface.

14. The vehicle component of claim 12, wherein said array of proximity sensors is a N×1 array.

15. The vehicle component of claim 12, wherein said array of proximity sensors is at least a 2×2 array.

16. A vehicle component comprising:
   a console surface that defines an activation surface;
   a circuit board proximate said activation surface; and an array of capacitive sensors, each of which emit a field that combine to form an activation field to activate a single proximity switch responsive to a user finger, wherein a lateral direction of said activation field is approximately equal to said activation surface and greater than a longitudinal direction of said activation field.

17. The vehicle component of claim 16 being a hidden dome lamp, wherein said console surface is a headliner.

18. The vehicle component of claim 16 being a capacitive moon roof switch.

19. The vehicle component of claim 16 being a light bar switch.

20. The vehicle component of claim 16, wherein said lateral direction of said activation field extends approximately parallel to said activation surface, and said longitudinal direction of said activation field extends approximately perpendicular to said activation surface.

21. The vehicle component of claim 16, wherein each of the array of capacitive sensors are not independently controlled.

22. A proximity switch comprising:
an activation surface; and
an array of capacitive sensors each emitting a sensor field that combine to form an activation field for activating the proximity switch responsive to a user finger commanded input, wherein a lateral direction of said activation field is approximately equal to said activation surface and greater than a longitudinal direction of said activation field extending approximately perpendicular to said activation surface.

* * * * *